United States Patent
Katata et al.

[11] Patent Number: 6,001,718
[45] Date of Patent: Dec. 14, 1999

[54] SEMICONDUCTOR DEVICE HAVING A TERNARY COMPOUND LOW RESISTIVE ELECTRODE

[75] Inventors: Tomio Katata; Katsuya Okumura, both of Yokohama, Japan

[73] Assignee: Kabushiki Kaisha Toshiba, Kawasaki, Japan

[21] Appl. No.: 08/941,253

[22] Filed: Sep. 30, 1997

[51] Int. Cl.$^6$ .................. H01L 21/3205; H01L 21/4763
[52] U.S. Cl. .................. 438/592; 438/303; 438/595; 438/655
[58] Field of Search .................. 438/592, 595, 438/303

[56] References Cited

U.S. PATENT DOCUMENTS

| | | | |
|---|---|---|---|
| 4,800,177 | 1/1989 | Nakamae | 437/193 |
| 4,816,425 | 3/1989 | McPherson | 437/200 |
| 4,977,098 | 12/1990 | Yu et al. | 437/31 |
| 5,164,333 | 11/1992 | Schwalke et al. | 437/200 |
| 5,318,924 | 6/1994 | Lin et al. | 437/192 |
| 5,364,803 | 11/1994 | Lur et al. | 437/40 |
| 5,393,685 | 2/1995 | Yoo et al. | 437/44 |
| 5,449,631 | 9/1995 | Giewont et al. | 437/41 |
| 5,457,069 | 10/1995 | Chen et al. | 437/190 |
| 5,518,958 | 5/1996 | Giewont et al. | 437/186 |
| 5,518,960 | 5/1996 | Tsuchimoto . | |
| 5,543,362 | 8/1996 | Wu | 437/200 |
| 5,545,592 | 8/1996 | Iacoponi | 437/200 |
| 5,554,566 | 9/1996 | Lur et al. | 437/193 |
| 5,559,047 | 9/1996 | Urabe | 437/41 |
| 5,576,572 | 11/1996 | Maeda et al. | 257/378 |
| 5,837,601 | 11/1998 | Matsumoto . | |

OTHER PUBLICATIONS

Fujii etal., A Thermally Stable Ti–W Salicide for Deep–Submicron Logic with Embedded DRAM, IEEE, 1996.

*Primary Examiner*—Richard Booth
*Assistant Examiner*—Ron Pompey
*Attorney, Agent, or Firm*—Banner & Witcoff, Ltd.

[57] ABSTRACT

A gate oxide film is formed on a silicon substrate, and a poly-silicon layer is formed on the gate oxide film. A tungsten silicide layer containing titanium is formed on the poly-silicon layer. A silicon nitride film is formed on the tungsten silicide layer. The poly-silicon layer, the tungsten silicide layer containing titanium, and the tungsten silicide layer containing titanium are subjected to patterning, and are thereafter, thermally oxidized to form oxide film on side walls of the layers. In this thermal oxidation, titanium deoxidizes and removes a native oxide film on the poly-silicon layer, so that silicon can be diffused from the poly-silicon layer to the tungsten silicide layer.

20 Claims, 4 Drawing Sheets

SEMICONDUCTOR DEVICE HAVING A TERNARY COMPOUND LOW RESISTIVE ELECTRODE

BACKGROUND OF THE INVENTION

The present invention relates to a semiconductor device and a manufacturing method thereof, which are applicable to gate wirings and interconnect wirings of a MOS transistor.

For example, a gate electrode of a MOS transistor generally adopts a layer structure of a poly-silicon and a refractory metal silicide. To form this kind of gate electrode, at first, a gate oxide film is formed on a silicon substrate, and further, poly-silicon and refractory metal silicide are sequentially deposited on the gate oxide film. Thereafter, a resist is applied onto the refractory metal silicide and is subjected to patterning. With this resist pattern used as a mask, the poly-silicon and the refractory metal silicide are etched to form a gate electrode. Subsequently, these components are post-oxidized in an atmosphere of diluted oxygen at a high temperature, to recover damages caused by the etching.

Meanwhile, material of the gate electrode may be, for example, a titanium silicide/poly-silicon structure in which titanium silicide is layered on poly-silicon, a tungsten silicide/poly-silicon structure in which tungsten silicide is layered on poly-silicon, or the like. However, the following problems will occur in case where a gate electrode using such a layer structure is subjected to post-oxidation.

FIG. 5 shows a case of a layer structure consisting of poly-silicon and titanium silicide. A gate oxide film 51 is formed on the silicon substrate 50, and a poly-silicon layer 52 is formed on the gate oxide film 51. A titanium silicide layer (TiSix) 53 is formed on the poly-silicon layer 52 by sputtering. The titanium silicide layer 53 thus sputtered is made of amorphous, and is thereafter crystallized through high-temperature processing. This high-temperature processing is a step in which silicon nitride is deposited on titanium silicide by LP-CVD (Low Pressure Chemical Vapor Deposition) or side walls of a gate electrode are oxidized.

In case where this high-temperature processing is thus carried out, poly-silicon and titanium silicide are partially inverted or agglomeration occurs. When inversion occurs, titanium silicide 53 penetrates through poly-silicon 52 and has a contact with a gate oxide film 51, as shown in FIG. 6. In addition, when agglomeration occurs, grains of titanium silicide 53 are formed on poly-silicon 52. When inversion occurs as described above, characteristics of the gate oxide film are degraded. When agglomeration occurs, the sheet resistance of the gate electrode is extremely raised.

Meanwhile, FIG. 8 shows a structure in which a tungsten silicide layer 54 and a silicon nitride layer 55 are layered, in place of a titanium silicide layer, on the poly-silicon layer 52. In this case, problems like inversion or agglomeration described above do not occur. However, in case of the tungsten silicide, in a step of performing a high-temperature heat treatment to form an oxide film 56 on the side walls of poly-silicon 52 and tungsten silicide 54, abnormal oxidation occurs on the side walls of the tungsten silicide 54 and $WO_3+SiO_2$ 57 is formed, as shown in FIG. 8. This abnormal oxidation is considered to be caused by a native oxide film 58 remaining at the boundary between the poly-silicon and the tungsten silicide. This means that the remaining native oxide film 58 prevents silicon from moving from the poly-silicon 52 to the tungsten silicide 54, so that the amount of silicon supplied to the tungsten silicide 54 from the poly-silicon 52 is insufficient. It is therefore considered that the side surface portion of the tungsten silicide 54 is rich in tungsten, and $WO_3+SiO_2$ grows in this portion. Specifically, a reaction represented by the following reaction formula occurs at the side wall of the tungsten silicide 54, thereby forming $WO_3$.

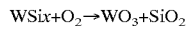

Thus, a semiconductor device using the titanium polycide or tungsten polycide causes inversion or agglomeration or abnormal oxidization in a high-temperature heat treatment step, and therefore, is not satisfactory.

BRIEF SUMMARY OF THE INVENTION

The present invention has been made in view of the above situation, and has an object of providing a semiconductor device and a manufacturing method thereof which does not cause inversion or agglomeration and which can prevent abnormal oxidization.

The present invention is achieved by a method as follows:

A method of manufacturing a semiconductor device, comprising steps of:

forming an oxide film on a semiconductor substrate;

forming a poly-silicon layer on the oxide film, the poly-silicon layer having a surface including a native oxide film;

forming a tungsten silicide layer on the poly-silicon layer, the tungsten silicide layer containing metal capable of forming an oxide which is thermally more stable than a silicon oxide;

patterning the poly-silicon layer and the tungsten silicide layer; and forming an oxide film on side walls of the poly-silicon layer and the tungsten silicide layer, by a heat treatment, wherein the metal deoxidizes and removes the native oxide film during the heat treatment.

According to the method described above, the tungsten silicide layer contains metal capable of forming an oxide which is thermally more stable than a silicon oxide, and the metal reduces and removes a native oxide film during a heat treatment. Therefore, silicon can be sufficiently supplied to side walls of the tungsten silicide layer, so that abnormal oxidization can be prevented and an oxide film having a desired film thickness can be formed.

The metal is one of titanium, zirconium, hafnium, aluminum, and magnesium.

In addition, same advantages as obtained in case of using a tungsten silicide layer can be obtained if a cobalt silicide layer containing the metal described above is used in place of the tungsten silicide layer containing the metal described above.

Further, a first metal layer and a tungsten silicide layer may be layered on the poly-silicon layer, in place of the tungsten silicide layer containing the metal described above, or a second metal layer may further be formed on the tungsten silicide layer.

A semiconductor device manufactured in the method described above attains excellent characteristics, and in particular, a gate electrode of a low resistance can be formed when the present invention is applied to a MOS transistor.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

In the following, embodiments of the present invention will be explained.

FIGS. 1A to 1D show a first embodiment of the present invention. A semiconductor device according to the first embodiment is applicable to a gate electrode or an interconnect wiring in a MOS transistor, for example, and has a layer structure in which a poly-silicon layer 13 and a tungsten silicide layer (or tungsten titanium silicide layer) 14 including titanium are layered on each other. In the following, a method of manufacturing the semiconductor device will be explained below.

Figure 1A:
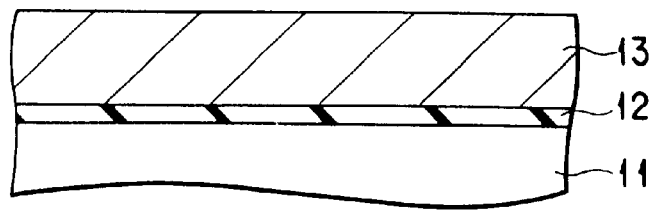
FIGS. 1A to 1D show a first embodiment of the present invention and are cross-sections showing a manufacturing step.

At first, as shown in FIG. 1A, a gate oxide film 12 is formed on a silicon substrate 11, and for example, a poly-silicon layer 13 having a film thickness of 100 nm is formed on the gate oxide film 12. Thereafter, impurities are introduced into the poly-silicon layer 13 by ion-implantation, for example. The impurities are N-type impurities, e.g., phosphorus if the semiconductor device is a dynamic random access memory (DRAM). If the semiconductor device is a logic integrated circuit, the impurities are N-type impurities and P-type impurities (e.g.,).

Figure 1B:
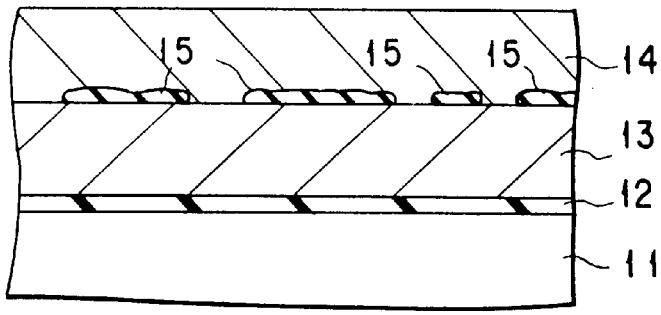

Next, the surface of the poly-silicon layer 13 is wet-cleaned with hydrofluoric acid (HF), and immediately thereafter, a tungsten titanium silicide layer (WTixSiy) 14 having a film thickness of, for example, 30 to 100 nm, is sputtered and formed on the poly-silicon layer 13, as shown in FIG. 1B. The wet-cleaning with hydrofluoric acid is performed for the purpose of removing a native oxide film ($SiO_2$) formed on the surface of the poly-silicon layer 13. However, it is difficult to completely remove the native oxide film, so that a native oxide film 15 remains at a boundary portion between the poly-silicon layer 13 and the tungsten titanium silicide layer 14. The amount of titanium contained in the tungsten titanium silicide layer 14 may be such a value which is enough to deoxidize the native oxide film 15, and may be 5% or so of the whole amount (e.g., approximately 50 angstrom in terms of only the thickness of titanium). The amount of silicon is approximately 2.5 to 2.8 times that of the tungsten (i.e. W:Si=1:2.5 to 2.8), for example.

Figure 2A:
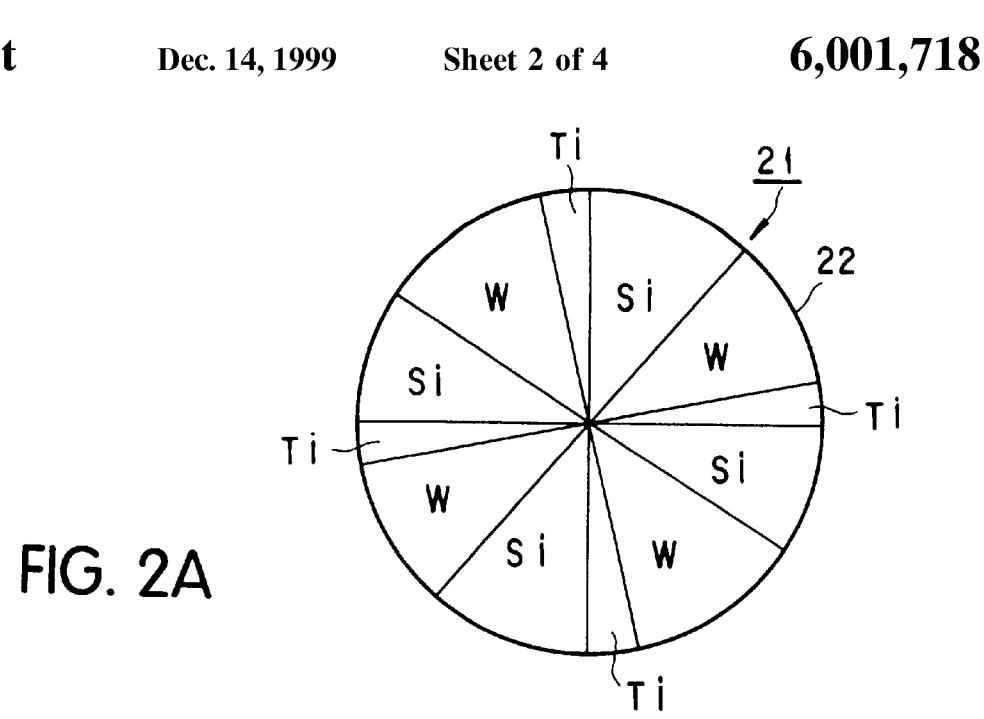
FIGS. 2A to 2C are plan views showing an example of a target.
Figure 2B:
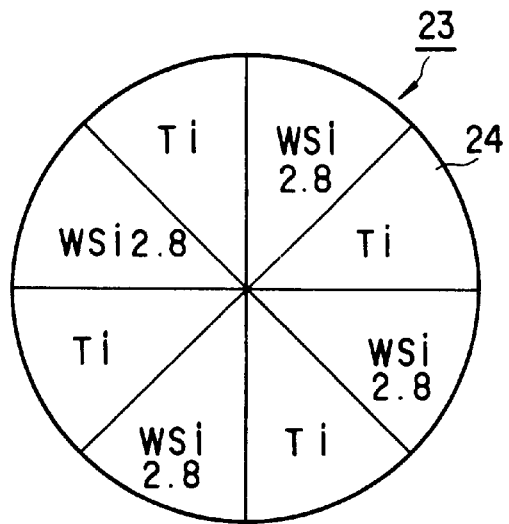
Figure 2C:
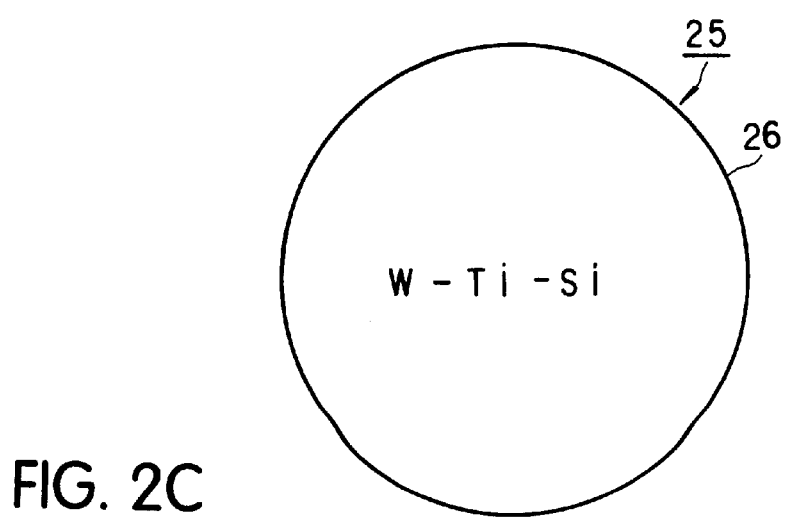

FIGS. 2A to 2C show a target of sputtering used for forming the tungsten titanium silicide layer 14 described above. FIG. 2A shows a mosaic target 21, for example. In case of this mosaic target 21, tungsten (W), silicon (Si), and titanium (Ti) are arranged like a mosaic on the surface of a target base 22.

FIG. 2B shows another mosaic target 23. In case of this mosaic target 23, tungsten silicide ($WSi_{2.8}$) and titanium (Ti) are arranged like a mosaic on the surface of a target base 24.

FIG. 2C shows a W—Ti—Si composite target 25. In case of this composite target 25, an alloy of tungsten, silicon, and titanium is provided on the surface of the target base 26.

In these targets, the amounts of tungsten, silicon, and titanium are arranged as described above. Any of these targets can form tungsten titanium silicide. This embodiment adopts a composite target shown in FIG. 2C.

In addition, a tungsten titanium silicide layer can be formed by alternately sputter tungsten silicide WSix and titanium silicide TiSix with use of the target of tungsten silicide WSix and the target of titanium silicide TiSix.

Figure 1C:
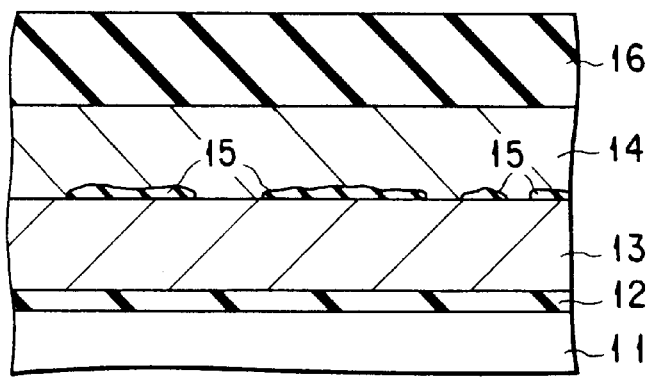

In the next, as shown in FIG. 1C, a silicon nitride film 16 having, for example, a thickness of 100 to 300 nm is deposited on the tungsten titanium silicide layer 14 by means of an LP-CVD method, for example. The sputtered tungsten silicide layer 14 is made of amorphous, and the tungsten silicide layer 14 is crystallized in a step of forming the silicon nitride film 16.

Figure 1D:
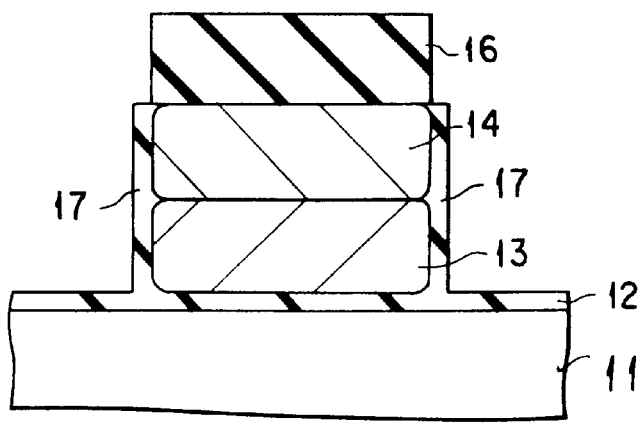

The poly-silicon layer 13, the tungsten silicide layer 14, and the silicon nitride film 16 thus layered are patterned into shapes of gate electrodes and interconnect wirings, as shown in FIG. 1D. Thereafter, the poly-silicon layer 13 and the tungsten silicide layer 14 are oxidized in an oxygen atmosphere at 850 to 950° C., so that oxide films 17 are formed on the side walls of these layers.

In the above step of oxidizing side walls, titanium contained in the tungsten titanium silicide layer 14 reacts with oxygen $O_2$ of a native oxide film ($SiO_2$) 15 positioned between the tungsten titanium silicide layer 14 and the poly-silicon layer 13 to form titanium oxide $TiO_2$, thereby removing the native oxide film 15. Thus, the following reduction reaction occurs.

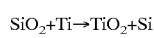

$$SiO_2 + Ti \rightarrow TiO_2 + Si$$

Heats of formation of $TiO_2$, $WO_3$, and $SiO_2$ ($-\Delta H$) are respectively 944.1 kJ, 838.6 kJ, and 910.9 kJ. As is apparent from this, the heat of formation of $TiO_2$ is greater than the heat of formation of $SiO_2$. This means that Ti can reduce the amount of $SiO_2$ at the boundary between tungsten titanium silicide and poly-silicon.

Thus, in the step of oxidizing the side walls, a native oxide film 15 is removed from the boundary portion between the poly-silicon layer 13 and the tungsten titanium silicide layer 14, and therefore, silicon can be smoothly diffused from the poly-silicon layer 13 to the tungsten titanium silicide layer 14. Therefore, side wall portions of the tungsten titanium silicide layer 14 can prevents tungsten from being rich, so that an oxide film 17 can be formed by avoiding abnormal oxidization. In addition, since the ratio of titanium to tungsten is extremely low, inversion and agglomeration can be prevented and the sheet resistance can be reduced. Since no abnormal oxidization occur, the thickness of an oxide film 17 can be easily controlled, for example, within a range of 150 to 200 angstrom, upon requests.

After the above-mentioned thermal treatment for oxidizing the side walls, the tungsten titanium silicide layer 14 contains $WSi_2$ grains, $TiSi_2$ grains, and Si grains.

According to the first embodiment, a tungsten titanium silicide layer 14 is formed on a poly-silicon layer 13. Therefore, titanium in the tungsten titanium silicide layer 14 deoxidizes and removes the native oxide film 15, so that silicon can be sufficiently supplied to side walls of the tungsten titanium silicide layer 14. Therefore, abnormal oxidization is prevented and an excellent oxide film is formed.

Further, since abnormal oxidization can thus be prevented, the film thickness of the oxide film 17 can be easily controlled, so that the processing window can advantageously be widened. Hence, the yield can be improved.

In addition, the side wall oxidization step can be performed at a relatively low temperature of 850 to 950° C. Therefore, impurities introduced into the poly-silicon layer 13 can be prevented from passing through the gate oxide film 12 and from being diffused in the silicon substrate 11. Further, as for the tungsten titanium silicide layer 14, inversion and agglomeration are prevented so that a gate electrode of a low resistance can be formed. Particularly, in case of a P-channel MOS transistor, boron introduced into the poly-silicon layer 13 is prevented from falling so that a P+ gate electrode of a low resistance can be formed.

In the first embodiment, a tungsten titanium silicide layer containing titanium is formed on a poly-silicon layer. However, metal to be contained in the tungsten silicide layer is not limited to titanium, but may be one of zirconium (Zr), hafnium (Hf), aluminum (Al), magnesium (Mg) and the like, for example. Thus, the metal to be contained in the tungsten silicide layer may be metal which is capable of forming an oxide material which is thermally more stable than $SiO_2$, in the step of oxidizing side walls for the purpose of deoxidizing and reduce a native oxide film.

Further, in the first embodiment, although tungsten silicide containing titanium is used, cobalt silicide (CoSix) can be used in place of tungsten silicide. In this case, cobalt silicide can be coupled with any one of titanium, zirconium, hafnium, aluminum, magnesium, and the like.

Figure 3A:
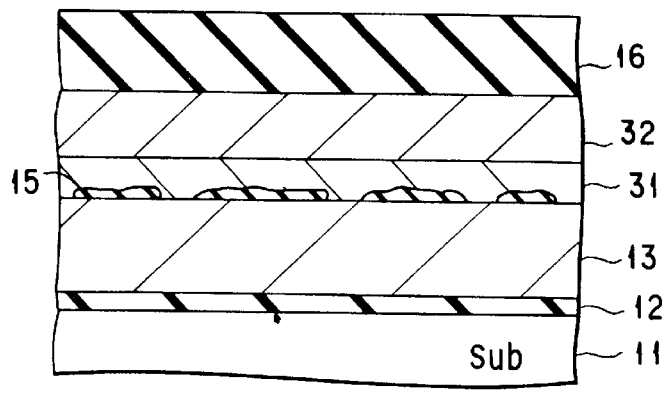
FIGS. 3A and 3B are cross-sections showing a second embodiment of the present invention.
Figure 3B:
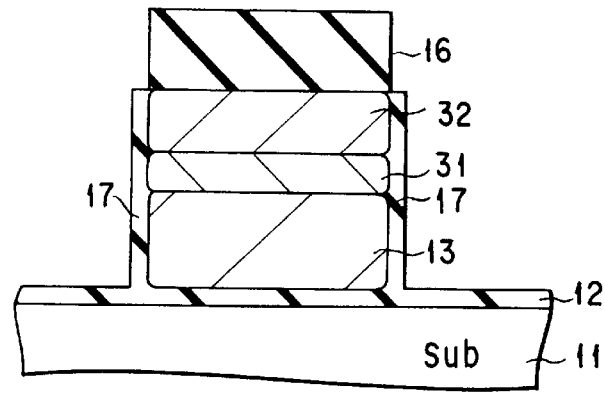

FIGS. 3A and 3B show a second embodiment. In the second embodiment, portions which are the same as those of the first embodiment are denoted by same reference symbols, and only the portions of the second embodiment which are different from portions of the first embodiment will be explained below.

In FIG. 3A, a titanium silicide layer (TiSix) 31 is formed on a poly-silicon layer 13 by sputtering, for example, with use of a Ti—Si composite target. The titanium silicide layer 31 covers a native oxide film 15 on the poly-silicon layer 13. A tungsten silicide layer (WSix) 32 is formed on the titanium silicide layer 31, for example, with use of a W—Si composite target. The ratio of titanium to tungsten is adjusted by means of the ratio of the film thickness of the titanium silicide layer 31 to the film thickness of the tungsten silicide layer 32. The film thickness of the titanium silicide layer 31 is, for example, approximately 50 angstrom, and the film thickness of the tungsten silicide layer 32 varies within a range of, for example, 500 to 1500 angstrom upon requirements. The silicon nitride film 16 described above is formed on the tungsten silicide layer 32.

Thereafter, as shown in FIG. 3B, the poly-silicon layer 13, titanium silicide layer 31, tungsten silicide layer 32, and the silicon nitride film 16 are patterned into shapes of gate electrodes and interconnect wirings. In the next, the poly-silicon layer 13, the titanium silicide layer 31, and the tungsten silicide layer 32 are oxidized, to form oxide films 17 on the side walls of these layers. In this stage, titanium contained in the titanium silicide layer 31 deoxidizes and removes a native oxide film 15. Therefore, abnormal oxidization is prevented and an oxide film 17 having a desired film thickness can be formed.

Figure 4A:
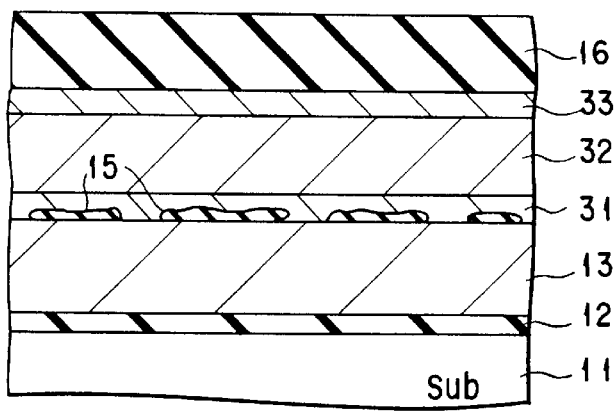
FIGS. 4A and 4B are cross-sections showing a third embodiment of the present invention.
Figure 4B:
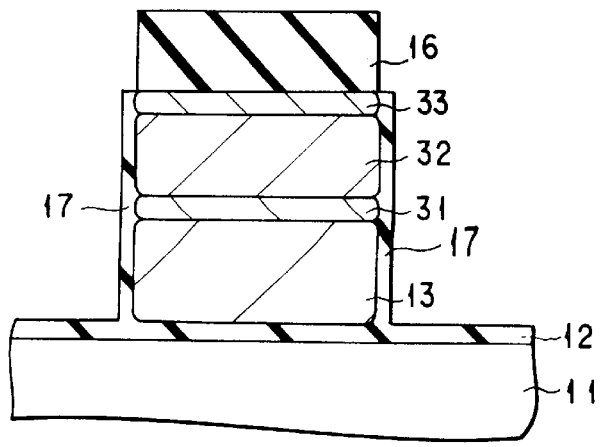
Figure 5:
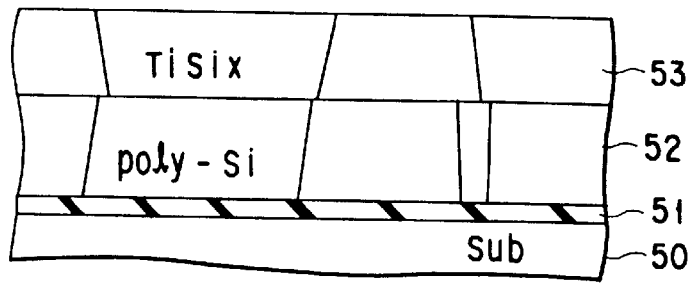
FIG. 5 is a cross-section showing a layer structure of titanium silicide/poly-silicon.
Figure 6:
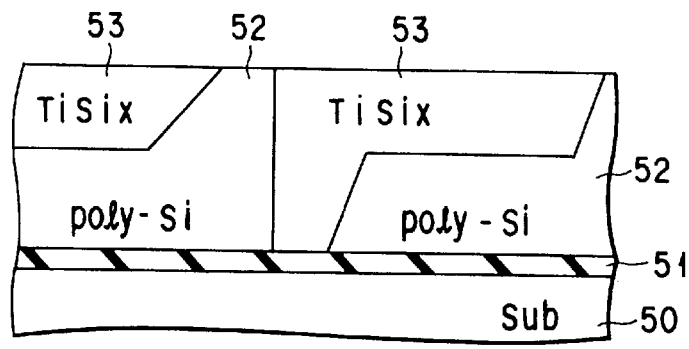
FIG. 6 is a cross-section showing a state of inversion.
Figure 7:
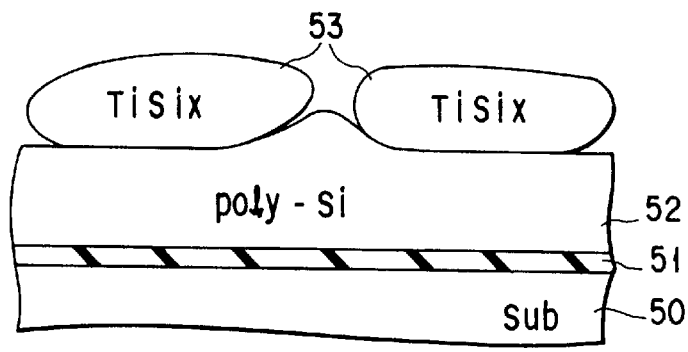
FIG. 7 is a cross-section showing agglomeration.
Figure 8:
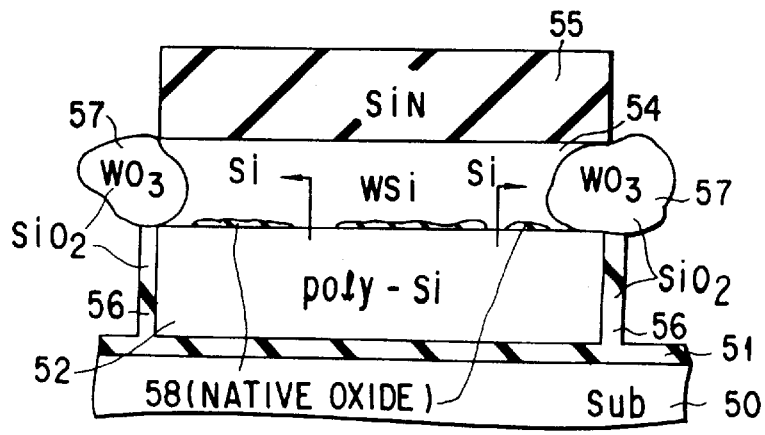
FIG. 8 is a cross-section showing abnormal oxidization.

FIGS. 4A and 4B show a third embodiment of the present invention which is a modification of the embodiment shown in FIGS. 3A and 3B. The third embodiment differs from the second embodiment in the point that a titanium silicide layer (TiSix) 33 is further formed, by sputtering, between the tungsten silicide layer 32 and the silicon nitride film 16. Except for this point, the third embodiment has the same structure as that of the second embodiment. The method of forming a titanium silicide layer 33 is the same as those of the titanium silicide layer 31. The thickness of the titanium silicide layer 33 varies within a range of 100 to 1000 angstrom upon requirements.

As shown in FIG. 4B, the poly-silicon layer 13, the titanium silicide layer 31, the tungsten silicide layer 32, the titanium silicide layer 33, and the silicon nitride film 16 are patterned into shapes of gate electrodes and interconnect wirings. In the next, the poly-silicon layer 13, the titanium silicide layer 31, the tungsten silicide layer 32, and the titanium silicide layer 33 are oxidized in an oxygen atmosphere at 850 to 950° C. Oxide films 17 are formed on side walls of these layers. In this stage, titanium of the titanium silicide layer 31 deoxidizes and removes a native oxide film 15.

According to the third embodiment, since a titanium silicide layer 33 is provided on the tungsten silicide layer 32, the resistances of the gate electrodes and interconnect wirings can be lowered and SiN can be prevented from being diffused into the tungsten silicide layer 32.

In the second and third embodiments, the titanium silicide layers 31 and 33 may be replaced by layers of titanium, zirconium, hafnium, aluminum, magnesium or silicide of any these metals.

Further, in the second and third embodiments, tungsten silicide can be replaced with cobalt silicide (CoSix), like in the first embodiment. In this case, cobalt silicide can be coupled with any one of titanium, zirconium, hafnium, aluminum, and magnesium.

Additional advantages and modifications will readily occurs to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. A method of manufacturing a semiconductor device, comprising steps of:

forming an oxide film on a semiconductor substrate;

forming a poly-silicon layer on said oxide film, said poly-silicon layer having a surface including a native oxide film;

forming a tungsten silicide layer on said poly-silicon layer, said tungsten silicide layer containing metal capable of forming an oxide which is thermally more stable than silicon oxide;

patterning said poly-silicon layer and said tungsten silicide layer; and forming an oxide film on side walls of said poly-silicon layer and said tungsten silicide layer, by a heat treatment, wherein said metal deoxidizes and removes said native oxide film during the heat treatment.

2. A method according to claim 1, wherein said tungsten silicide layer containing said metal is formed by sputtering with use of a target in which tungsten, silicon, and titanium are arranged like a mosaic.

3. A method according to claim 1, wherein said tungsten silicide layer containing said metal is formed by sputtering with use of a target in which tungsten silicide and titanium are arranged like a mosaic.

4. A method according to claim 1, wherein said tungsten silicide layer containing said metal is formed by sputtering with use of a composite target made of tungsten-titanium-silicon.

5. A method according to claim 1, wherein said metal is one of titanium, zirconium, hafnium, aluminum, and magnesium.

6. A method according to claim 1, wherein said poly-silicon layer contains P-type impurities.

7. A method according to claim 5, wherein said poly-silicon layer and said tungsten silicide layer constitute a gate electrode of a P-channel MOS transistor.

8. A method according to claim 1, wherein said heat treatment is carried out at a temperature of 850 to 950° C.

9. A method of manufacturing a semiconductor device, comprising steps of:

forming an oxide film on a semiconductor substrate;

forming a poly-silicon layer on said oxide film, said poly-silicon layer having a surface including a native oxide film;

forming a cobalt silicide layer on said poly-silicon layer, said cobalt silicide layer containing metal capable of forming an oxide which is thermally more stable than silicon oxide;

patterning said poly-silicon layer and said cobalt silicide layer; and forming oxide films on side walls of said poly-silicon layer and said cobalt silicide layer, wherein said metal deoxidizes and removes said native oxide film.

10. A method according to claim 9, wherein said metal is one of titanium, zirconium, hafnium, aluminum, and magnesium.

11. A method according to claim 9, wherein said poly-silicon layer contains P-type impurities.

12. A method according to claim 11, wherein said poly-silicon layer and said cobalt silicide layer constitute a gate electrode of a P-channel MOS transistor.

13. A method according to claim 9, wherein said heat treatment is carried out at a temperature of 850 to 950° C.

14. A method of manufacturing a semiconductor device, comprising steps of:

forming an oxide film on a semiconductor substrate;

forming a poly-silicon layer on said oxide film, said poly-silicon layer having a surface including a native oxide film;

forming a first metal layer on said poly-silicon layer;

forming a tungsten silicide layer on said first metal layer, said first metal layer being made of metal capable of forming an oxide which is thermally more stable than silicon oxide;

patterning said poly-silicon layer, said first metal layer, and said tungsten silicide layer; and forming oxide films on side walls of said poly-silicon layer, said first metal layer, and said tungsten silicide layer, by a heat treatment, wherein said first metal layer deoxidizes and removes said native oxide film during said heat treatment.

15. A method according to claim 14, further comprising a step of forming a second metal layer on said tungsten silicide layer.

16. A method according to claim 15, wherein said first and second metal layers are made of titanium silicide.

17. A method according to claim 15, wherein said first and second metal layers are made of one of titanium, zirconium, hafnium, aluminum, magnesium, and any silicide of these metals.

18. A method according to claim 14, wherein said poly-silicon layer containing P-type impurities.

19. A method according to claim 18, wherein said poly-silicon layer, said metal layer, and said tungsten silicide layer constitute a gate electrode of a P-channel MOS transistor.

20. A method according to claim 14, wherein said heat treatment is carried out at a temperature of 850 to 950° C.

* * * * *